United States Patent [19]

Davis

[11] Patent Number: 4,587,204
[45] Date of Patent: May 6, 1986

[54] PHOTOPATTERNABLE DIELECTRIC COMPOSITIONS, METHOD FOR MAKING AND USE

[75] Inventor: Gary C. Davis, Albany, N.Y.

[73] Assignee: General Electric Company, Schenectady, N.Y.

[21] Appl. No.: 695,601

[22] Filed: Jan. 28, 1985

Related U.S. Application Data

[62] Division of Ser. No. 527,581, Aug. 29, 1983, Pat. No. 4,515,887.

[51] Int. Cl.$^4$ .......................... G03C 5/16; G03F 7/26
[52] U.S. Cl. .................................... 430/325; 430/311; 430/330
[58] Field of Search ............... 430/283, 311, 325, 330

[56] References Cited

U.S. PATENT DOCUMENTS 4,017,340  4/1977  Yerman ............................. 427/93 X
4,321,319  3/1982  Shoji et al. ....................... 430/283 X Primary Examiner—John E. Kittle
Assistant Examiner—Cynthia Hamilton
Attorney, Agent, or Firm—William A. Teoli; James C. Davis, Jr.; James Magee, Jr.

[57] ABSTRACT

There is provided a photosensitive modified silicone-aromatic polyamide acid convertible to a patterned silicone-polyimide. A silicone-polyamide acid is modified with an isocyanatoalkylacrylate to produce a silicone-aromatic polyamide acid having acrylate alkylamide groups attached to the silicone-aromatic polyamide acid backbone by nitrogen-nuclear bound carbon linkages.

1 Claim, No Drawings

PHOTOPATTERNABLE DIELECTRIC COMPOSITIONS, METHOD FOR MAKING AND USE

This application is a division of application Ser. No. 527,581, filed 8/29/83, now U.S. Pat. No. 4515887.

BACKGROUND OF THE INVENTION

The present invention relates to a photosensitive silicone-aromatic polyamide acid useful as a photoresist convertible to a patterned dielectric. More particularly, the present invention relates to a method for modifying a silicone-aromatic polyamide acid with nuclear bound acrylate amide groups which are introduced by effecting reaction between an acrylic organoisocyanate and silicone-polyamide acid.

Prior to the present invention, photoresists-like materials are described which are based on a photoreactive precursor, as shown by Rubner et al, Production of Highly Heat-Resistant Film Patterns from Photoreactive Polymeric Precursors, Part 1. General Principle, (January 1976) and Production of Highly Heat-Resistant Film Patterns from Photoreactive Polymeric Precursors, Part 2. Polyimide Film Patterns, (May 1976), Siemens Forsch.-u. Entwickl.-Ber. Bd. 5 (1976) No. 2, by Springer-Verlag. A photoreactive polyamide is made by initially effecting reaction between an aromatic dianhydride, for example, pyromellitic dianhydride and allyl alcohol. The resulting aromatic dicarboxylic acid diester is then converted to the corresponding aromatic diacid chloride by reaction with thionyl chloride which is further reacted with an aromatic diamine to produce a photoreactive aromatic polyamide ester. The aforementioned photoreactive polyimide precursor is then applied onto a substrate by spin coating and exposed with the aid of a mask, followed by developing the treated surface with an organic solvent to produce a negative photoresist. The negatively patterned aromatic polyamide ester is then heated to convert it to a patterned polyimide.

Although valuable results have been achieved with the aforementioned photoreactive aromatic polyamide ester, those skilled in the art know that the use of a chlorinating agent, such as thionyl chloride, to convert the aromatic dicarboxylic acid to the corresponding acid chloride prior to the polymerization reaction with aromatic diamine, can result in the generation of a residual chloride contaminant which can interfere with the utility of the resulting aromatic polyimide as a dielectric.

The present invention is based on my discovery that photosensitive polyamide acid useful as a photoresist and convertible to a patterned insulating layer free of chloride contamination, can be made by initially making a silicone-aromatic polyamide acid, consisting essentially of chemically combined units of the formulas,

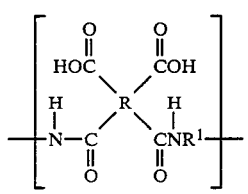

(1)

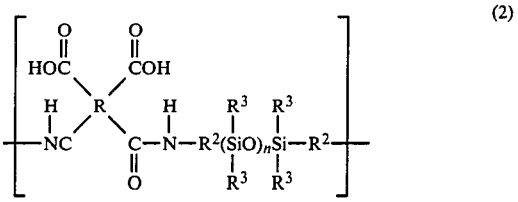

(2)

where R is a tetravalent $C_{(6-30)}$ aromatic radical selected from

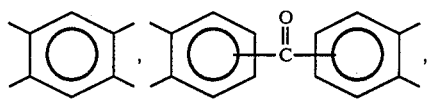

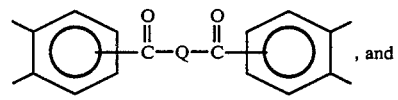, and

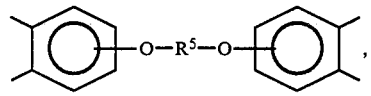, $R^1$ is a divalent $C_{(2-13)}$ organic radical, $R^2$ is a divalent $C_{(2-8)}$ organic radical, $R^3$ is selected from $C_{(1-13)}$ monovalent hydrocarbon radicals and substituted $C_{(1-13)}$ monovalent hydrocarbon radicals, Q is a divalent radical having the formula, $$-ZR^4Z-,$$

Z is selected from —O— and —NH—, $R^4$ and $R^5$ are selected from $C_{(2-18)}$ organic radicals and n is an integer equal to 1 to 20 inclusive.

The above silicone-aromatic polyamide acid can be reacted with an isocyanato organo acrylate to produce a modified silicone-aromatic polyamide acid having chemically combined acrylate amide groups attached to the silicone-aromatic polyamide acid backbone by nitrogen-nuclear bound carbon linkages. Thereafter, a sensitizer can be added to the modified silicone-aromatic polyamide acid to produce a photoresist.

STATEMENT OF THE INVENTION

There is provided by the present invention, a photoresist comprising by weight, (A) up to 95% of an inert organic solvent,
(B) at least 5% of a modified silicone-aromatic polyamide acid consisting essentially of chemically combined units of the formulas,

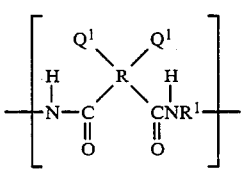

(3)

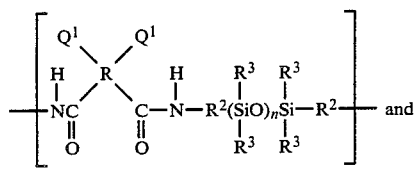

(C) an effective amount of sensitizer,
where $Q^1$ is a monovalent radical selected from carboxy and acrylate amide groups of the formula,

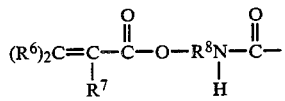

and there are at least 10 mole percent of formula (5) radicals based on the total moles of carboxy radicals and formula (5) radicals in the silicone-aromatic polyamide, R, $R^1$, $R^2$, $R^3$ and n are as previously defined, $R^6$ and $R^7$ are selected from hydrogen and $C_{(1-8)}$ alkyl radicals and $R^8$ is a $C_{(1-13)}$ divalent organo radical.

There is also provided by the present invention, a method for patterning an insulative silicone-aromatic polyimide layer onto a substrate, which comprises (1) spin coating onto a substrate under substantially light-free conditions, a photoresist composition comprising an organic solvent solution of a modified silicone-aromatic polyamide acid consisting essentially of chemically combined units of formula (3) and (4) having at least 10 mole percent of nuclear bound acrylate amide groups of formula (5) based on the total moles of the carboxy groups and nuclear bound acrylate amide groups in the modified silicone-aromatic polyamide acid, (2) allowing the spin coated photoresist of (1) to dry, (3) exposing the treated substrate while it is masked for a time sufficient to cross-link the nuclear bound acrylate amide groups of the modified silicone-polyamide acid, (4) developing the resulting cross-linked modified silicone-aromatic polyamide acid treated substrate, and (5) heating the developed modified silicone-aromatic polyamide acid treated substrate at a temperature sufficient to convert aromatic polyamide acid to aromatic polyimide.

Radicals included by $R^1$ of formula (1), are for example, $C_{(2-8)}$ alkylene radicals, such as dimethylene, trimethylene, tetramethylene; $C_{(6-13)}$ arylene radicals, for example, phenylene, xylene, toluene; aralkylene radicals such as benzyl, phenylethyl and substituted such as halo substituted, $C_{(2-8)}$ alkylene, $C_{(6-13)}$ arylene and aralkylene radicals. Radicals included by $R^2$ are for example, $C_{(2-8)}$ alkylene radicals and arylene radicals of $R^1$. Radicals included within $R^3$ are selected from $C_{(1-13)}$ monovalent hydrocarbon radicals such as $C_{(1-8)}$ alkyl, for example, methyl, ethyl, propyl, $C_{(6-13)}$ aryl radicals such as phenyl, tolyl, xylyl and halogenated derivatives of such $R^3$ radicals such as chlorophenyl. Radicals included within $R^4$, are for example, alkylene radicals and arylene radicals of $R^1$.

Some of the radicals included with $R^5$ are, for example,

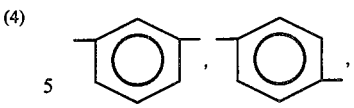

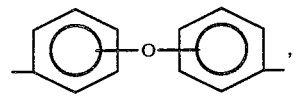

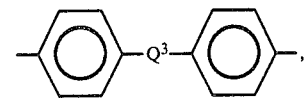

where $Q^3$ is selected from S,

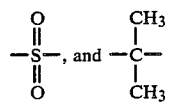

Radicals included within $R^6$ and $R^7$ are, for example, hydrogen and $C_{(1-8)}$ alkyl radicals such as methyl, ethyl, propyl, butyl. Radicals included within $R^8$ are alkylene and arylene radicals defined for R above.

The isocyanato organo acrylates which can be utilized in the practice of the present invention to modify the silicone-polyamide acids, are included within the following formula,

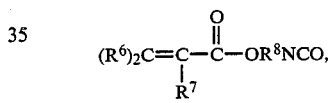

where $R^6$, $R^7$ and $R^8$ are as previously defined. More particularly there are included isocyanatoethylmethacrylate, isocyanatopropylmethacrylate, isocyanotoethylacrylate, isocyanatoethylcrotonate.

The silicone-polyamide acid consisting essentially of chemically combined units of formulas (1) and (2) which can be used in the practice of the present invention to produce the photosensitive modified silicone-polyamide acid can be made by initially reacting aromatic dianhydride with a mixture of aromatic diamine and amine organo terminated polydiorganosiloxane and an appropriate organic solvent under ambient conditions. Suitable aromatic dianhydrides which can be used are, for example, pyromellitic dianhydride, benzophenone dianhydride, anhydrides derived from trimellitic anhydride and organic diamines or organic glycols and aromatic bis(ether anhydride)s, such as 2,2-bis[4-(2,3-dicarboxyphenoxy)phenyl]propane dianhydride and 2,2-bis[4-(3,4-dicarboxyphenoxy)phenyl]propane dianhydride. Some of the aromatic diamines which can be used in the synthesis of the silicone-polyamide acid are, for example, m-phenylene diamine, p-phenylene diamine, 4,4'-diaminodiphenylpropane, 4,4'-diaminodiphenylmethane, benzidene, 4,4'-diaminodiphenylsulfide, 4,4'-diaminodiphenylsulfone, 4,4'-diaminodiphenylether.

Some of the amine organo terminated polydiorganosiloxanes which can be used in combination with the aforementioned aromatic dianhydride and aromatic diamine are included within the following formula,

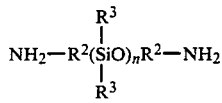

(6)

where $R^2$, $R^3$ and n are as previously defined.

In forming the silicone-polyamide acid, there can be utilized substantially equal moles of aromatic dianhydride and diamine component which can include the aromatic diamine and an amine terminated polydiorganosiloxane. Sufficient amine terminated polydiorganosiloxane can be used in combination with the aromatic dianhydride and aromatic diamine to provide for a silicone-polyamide acid having about 5 to 40% by weight of diorganosiloxane units based on the total weight of silicone-polyamide acid.

Modification of the silicone-polyamide acid can be achieved by agitating a mixture of the silicone-polyamide acid and the isocyanato organoacrylate in the substantial absence of light and in the presence of a appropriate organic solvent. Preferably, the silicone-polyamide acid is used as a solution in a dipolar aprotic solvent at from about 5 to 50% solids. Suitable dipolar aprotic solvents, are for example, N-methylpyrrolidone, dimethylformamide, dimethylacetamide, etc. The reaction mixture can be stirred at room temperature for a period of from 2 to 24 hours. There is an immediate evolution of carbon dioxide and in some instances, it has been found expedient to add a nonpolar organic solvent such as toluene to reduce the initial viscosity of the solution. A proportion of about 0.2 moles to 1.2 moles of the isocyanato organoacrylate per mole of the carboxy of the silicone-polyamide acid has been found to provide effective results. After modification of the silicone-polyamide acid with the isocyanatoorganoacrylate, the resulting modified polymer can be sensitized with an appropriate photoinitiator. There can be utilized from about 1 to 10% by weight of photoinitiator based on the weight of the acrylate organo amide modified silicone-polyamideacid. Suitable sensitizers of photoinitiators, are for example, Michler's ketone, benzophenone, chlorothioxanthone, 2,2-dimethoxy-2-phenylacetophenone each with N-methyldiethanolamine.

The sensitized silicone modified polyamide acid solution can then be stored in the absence of light at temperatures below about 10° C. for an extended shelf period, such as 6 months or more without substantial modification occurring in the photoresist solution.

A typical procedure for applying a patterned silicon-polyimide insulating layer onto a substrate, is to clean the substrate surface such as a silicone wafer, followed by spin coating the sensitized silicone modified polyamide acid onto the substrate surface. The treated substrate can then be dried at 100° C. for about 1 hour and thereafter masked and exposed in a conventional manner. Typical times, are for example, 30 seconds on a PPG ultraviolet processor, 5 minutes under an RS sunlamp. Un exposed areas can then be developed using 0.5N NaOH. The remaining patterned silicone modified polyamide acid can then be thermally tempered at temperatures in the range from 120° C. to 400° C. for about 0.5 to 3 hours with conversion to a silicone-polyimide insulating layer at temperatures at least as high as 300° C. for about 1 hour.

It has been further found that reaction between the isocyanato organoacrylate and the silicone polyamide acid can be facilitated by the use of an amine, such as triethylamine, 1,4-diazobicyclo[2.2.2]octane, or a tin compound such as dibutyltindilaurate, dibutyltindiacetate, which can be utilized at about 0.1 to 25% by weight, based on the weight of the isocyanato organo acrylate used.

In order that those skilled in the art will be better able to practice the invention, the following examples are given by way of illustration and not by way of limitation. All parts are by weight.

EXAMPLE 1

There is added 23.22 grams (0.12 moles) of methylenedianiline, followed by 12.6 grams (0.05 moles) of bis-1,3-gamma-aminopropyltetramethyldisiloxane to a solution of 54.00 grams (0.17 moles) of 3,3',4,4'-benzophenonetetracarboxylic dianhydride, dissolved in 250 cc of dry N-methylpyrrolidone. The addition is performed under a nitrogen atmosphere. The resulting solution is allowed to stir at room temperature for 24 hours. Based on method of preparation, there is produced a silicone-polyamide acid having about 18% by weight of chemically combined dimethylsiloxane based on the total weight of silicone-polyamide acid There is stirred at room temperature for a period of about 24 hours under a nitrogen atmosphere and under light-free conditions, 35 grams of a 28% solids solution in N-methylpyrrolidone of the above described silicone-polyamide acid and 5.5 grams of isocyanatoethylmethacrylate. There is an immediate evolution of carbon dioxide. There is added 15 grams of toluene to the mixture to improve its spin coating characteristics. In addition, there is added a mixture of 4 parts Michler's ketone and 4 parts N-methyldiethanolamine. The resulting solution is then stored at 4° C. under light-free conditions. Based on method of preparation, there is obtained a photosensitive silicone-polyamide acid having about 100 mole percent of nuclear bound methacrylate ethylamide groups based on the total moles of such groups and carboxy in the modified silicon-polyamide acid.

EXAMPLE 2

An acid washed silicon wafer is spin coated with the photosensitive silicone-polyamide acid of Example 1 and the resulting treated wafer is dried at 100° C. for 1 hour. The wafer is then masked and exposed for a period of 30 seconds to a PPG ultraviolet processor or for 5 minutes under an RS sunlamp. The wafer is then developed using a 0.5N NaOH aqueous solution. There is obtained a silicon wafer having a patterned silicone-polyamide acid insulating layer on its surface. The wafer is then heated a 200° C. for 1 hour followed by heating at 300° C. for 1 hour. There is obtained a silicon wafer having a patterned modified silicone-polyimide insulating layer on its surface.

EXAMPLE 3

A series of photosensitive methacrylateethylamide substituted silicone-polyamide acids are prepared in accordance with Example 1, utilizing a range of 0 to 1.5 equivalents of isocyanatoethylmethacrylate per equivalent of carboxy of the silicone-polyamide acid to determine the ratio of isocyanatoethylmethacrylate to carboxy needed for optimum photocrosslinking characteristics in the resulting photosensitive silicone-polyamide acid. Satisfactory cross-linking can be achieved with solutions free of gel after a 24 hour shelf period. In addition, the cross-linked films should be capable of withstanding thinning upon being developed for 1 minute with an aqueous 0.5N NaOH solution. The following results are obtained, where "IEM" is isocyanatoethylmethacrylate.

TABLE I

Determination of Optimum Ratio of IEM to Carboxylic acid

| Equivalent IEM/COOH[a] | Solution After Reaction (24 hrs) | Exposure and Development Results[b] |
|---|---|---|
| 0 | No gell | No Pattern, Film Dissolved |
| 0.2 | No gell | Pattern, Film Thinned |
| 0.5 | No gell | Pattern, Some Thinning |
| 1.0 | No gell | Pattern, Minimal Thinning |
| 1.2 | No gell | Pattern, Minimal Thinning |
| 1.5 | Gell | — |

[a]Reaction run at room temperature using 40% silicon-polyamide acid solution in N—methylpyrrolidone
[b]1.8 μ films (dried 60° C./20 min) prior to 30 sec. exposure (PPG UV Processor) and 1 min. developer (0.5N NaOH)

The above results show that a 1 to 1 ratio of isocyanatoethylmethacrylate to carboxy provides optimum crosslinking characteristics.

EXAMPLE 4

Various sensitizers for converting the silicone-polyamide acid of Example 1 modified with methacrylate ethylamide groups, or "modified silicone-polyamide acid", to the photosensitive state are evaluated. Sensitizer effectiveness is measured by determining the thickness of the modified silicone-polyamide acid after it is exposed and developed. As shown in Table II below, Michler's ketone is found to be the most effective sensitizer, where "Polymer" and PSiPI are isocyanatoethylmethacrylate modified silicone-polyamide acid:

TABLE II

Sensitizer Effectiveness on PSiPI Curing

| Sensitizer | % Sensitizer in Polymer[a] | Developer[b] Time[c] (min) | % of Initial Film[d] Thickness After Exposure[e] |
|---|---|---|---|
| None | — | 0.1 | 0 |
| 2,2-dimethoxy-2-phenylacetophenone | 3 | 0.5 | 32 |
| Benzophenone | 3 | 1.5 | 24 |
| Michler's Ketone | 3 | 1.5 | 80 |
| 2-Chlorothioxanthone | 4 | 2 | 60 |

[a]An equal percentage of N—methyldiethanolamine added to each sample
[b]0.5 N NaOH
[c]Development time was determined by the time it took to open the pattern
[d]Initial films dried 100° C./1 hr except 2-chlorothioxanthone film (100° C./2 hr).
[e]Exposed 5 minutes 10 inches under 4 RS sunlamps.

The above results show that Michler's ketone is the most effective senitizer for effecting the cure of the modified silicone-polyamide acid.

An additional investigation was made to determine the optimum concentration of Michler's ketone for maintaining the maximum percent of the initial film thickness after 5 minutes exposure under an RS sunlamp followed by development in a 0.5N NaOH solution. The following results were obtained:

TABLE III

Effect of Sensitizer Concentration on Film Thickness

| % Michler's Ketone[a] | Developer[b] Time[c] (min) | % of Initial Film[d] Thickness After Exposure And Development |
|---|---|---|
| 2 | 2 | 63 |
| 4 | 2 | 85 |
| 6 | 2 | 91 |
| 8 | 3 | 92 |
| 10 | 3 | 92 |

[a]Same as Table II
[b]Same as Table II
[c]Same as Table II
[d]Initial films dried 100° C./1 hr.

The above results show that an optimum concentration of Michler's ketone with respect retention of cross-linked silicone-polyamide acid thickness is about 4-6% by weight of the modified silicone-polyamide acid. In addition, films prepared using the Michler's ketone/N-methyldiethanolamine sensitizer system at the 4% level showed identical development behavior when exposed in air or nitrogen. Two micron films, after equivalent exposure times under RS sunlamps, maintained 71% of their original thickness after being developed for 6 minutes in 0.5N NaOH. It was further found that cures as short as 30 seconds were obtainable using particular equipment such as a PPG ultraviolet processor. However, both heat and light may be required in particular situations.

EXAMPLE 5

There was stirred a mixture under ambient conditions in N-methylpyrrolidone of 1 mole of a 30% solution of 2,2-bis[4-(3,4-dicarboxyphenoxy)phenyl]propane dianhydride, 0.3 mole of bis-1,3-γ-aminopropyltetramethyldisiloxane and 0.7 mole of methylene dianiline. After 2 hours of stirring, there was obtained a silicone-polyamide acid.

A mixture of 3.5 grams of a 30% solution in N-methylpyrrolidone of the above silicone-polyamide acid, 0.55 gram of isocyanatoethylmethacrylate and 5 drops of triethylamine, was stirred for 19 hours under ambient conditions. Based on method of preparation and IR data, there was obtained a silicone polyamide acid having nuclear bound methacrylate ethylamide groups.

The above modified silicone polyamide acid is found useful as a photopatternable dielectric composition on a copper clad laminate.

Although the above examples are directed to only a few of the very many variables which can be used in the practice of the present invention, it should be understood that the present invention is directed to a much broader variety of silicone-polyamide acid and isocyanatoalkylacrylates, sensitizers, methods for making such photosensitive silicone-polyamide acid and to methods for applying patterned insulating layers of silicone-polyimide on various substrates.

What I claim as new and desire to secure by Letters Patent of the United States is:

1. A method for patterning an insulative silicone-aromatic polyimide layer onto a substrate, which comprises
   (1) spin coating onto a substrate under substantially light-free conditions, a photoresist composition comprising an organic solvent solution of a modified silicone-aromatic polyamide acid having at least 10 mole percent of nuclear bound acrylate amide groups, based on the total moles of the carboxy groups and nuclear bound acrylate amide groups in the modified silicone-aromatic polyamide acid consisting essentially of chemically combined units of the formulas

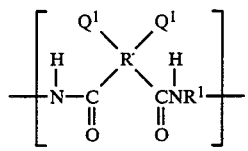

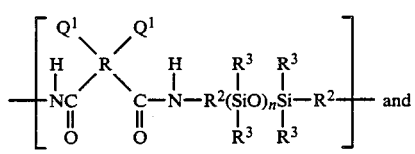 and (2) allowing the spin coated photosensitive silicone-polyamide acid of (1) to dry, (3) exposing the treated substrate while it is masked for a time sufficient to cross-link the nuclear bound acrylate amide groups of the modified silicone-polyamide acid, (4) developing the resulting modified silicon-aromatic polyamide acid treated substrate, and (5) heating the developed modified silicone-aromatic polyamide acid treated substrate at a temperature sufficient to convert aromatic polyamide acid to aromatic polyimide, where $Q^1$ is is a monovalent radical selected from carboxy and acrylateamide groups of the formula,

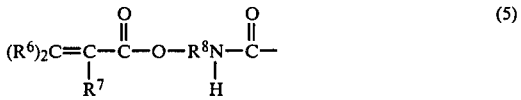

and there are at least 10 mole percent of acrylateamide groups based on the total carboxy and acrylateamide groups in the silicone-aromatic polyamide, where R is a tetravalent $C_{(6-30)}$ aromatic radical selected from the class consisting of

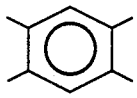

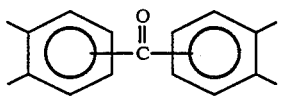

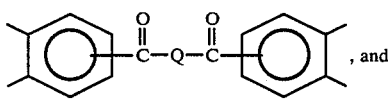, and

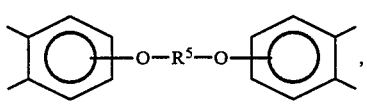, $R^1$ is a divalent $C_{(2-13)}$ organic radical, $R^2$ is a divalent $C_{(2-8)}$ organic radical, $R^3$ is selected from the class consisting of $C_{(1-13)}$ monovalent hydrocarbon radicals and substituted $C_{(1-13)}$ monovalent hydrocarbon radicals, Q is a divalent radical having the formula,

Z is selected from —O— and —NH—, $R^4$ and $R^5$ are $C_{(2-13)}$ organic radicals, $R^6$ and $R^7$ are selected from the group consisting of the class consisting of hydrogen and $C_{(1-8)}$ alkyl radicals, $R^8$ is a $C_{(1-13)}$ divalent organo radical and n is an integer equal to 1 to 20 inclusive.

* * * * *